United States Patent
Lien et al.

(10) Patent No.: US 9,443,825 B2
(45) Date of Patent: Sep. 13, 2016

(54) MULTI-FUNCTION MINIATURIZED SURFACE-MOUNT DEVICE AND PROCESS FOR PRODUCING THE SAME

(71) Applicant: SFI Electronics Technology Inc., Taoyuan (TW)

(72) Inventors: Ching-Hohn Lien, Taoyuan (TW); Xing-Xiang Huang, Taoyuan (TW); Hsing-Tsai Huang, Taoyuan (TW); Jie-An Zhu, Shanghai (CN); Hong-Zong Xu, Taoyuan (TW); Yi-Wei Chen, Taoyuan (TW); Jung-Chun Chiang, Taoyuan (TW)

(73) Assignee: SFI ELECTRONICS TECHNOLOGY INC., Taoyuan (TW)

( * ) Notice: Subject to any disclaimer, the term of this patent is extended or adjusted under 35 U.S.C. 154(b) by 0 days.

(21) Appl. No.: 15/018,896

(22) Filed: Feb. 9, 2016

(65) Prior Publication Data
US 2016/0240510 A1 Aug. 18, 2016

(30) Foreign Application Priority Data

Feb. 17, 2015 (TW) ............................. 104105626 A

(51) Int. Cl.
*H01L 21/48* (2006.01)
*H01L 23/48* (2006.01)
*H01L 25/065* (2006.01)
*H01L 25/00* (2006.01)

(52) U.S. Cl.
CPC ........... *H01L 25/0655* (2013.01); *H01L 25/50* (2013.01); *H01L 2225/06551* (2013.01)

(58) Field of Classification Search
CPC ................ H01L 2225/06551; H01L 25/0655; H01L 25/50; H01L 23/49816; H01L 23/3128; H01L 23/49827; H01L 23/481; H01L 23/50
See application file for complete search history.

(56) References Cited

U.S. PATENT DOCUMENTS

| | | | |
|---|---|---|---|
| 2015/0061095 A1* | 3/2015 | Choi | H01L 24/20 257/675 |
| 2015/0170991 A1* | 6/2015 | Li | H01L 25/0657 257/777 |

\* cited by examiner

*Primary Examiner* — Hoa B Trinh
(74) *Attorney, Agent, or Firm* — Bacon & Thomas, PLLC

(57) ABSTRACT

A surface-mount device (SMD) uses no conventional lead frame and contains a multi-function die module formed from either a single die or two or more dies electrically connected in series, in parallel, or in any combination of series and parallel, to provide such a SMD having one or more different functions including wave filtration, rectification, surge protection, sensing, current limiting, voltage regulation or prevention from voltage backflow, as compared to the prior art, the SMD disclosed is formed from fewer components, is simpler to manufacture and more effectively reduce layout wire length and noise.

7 Claims, 4 Drawing Sheets

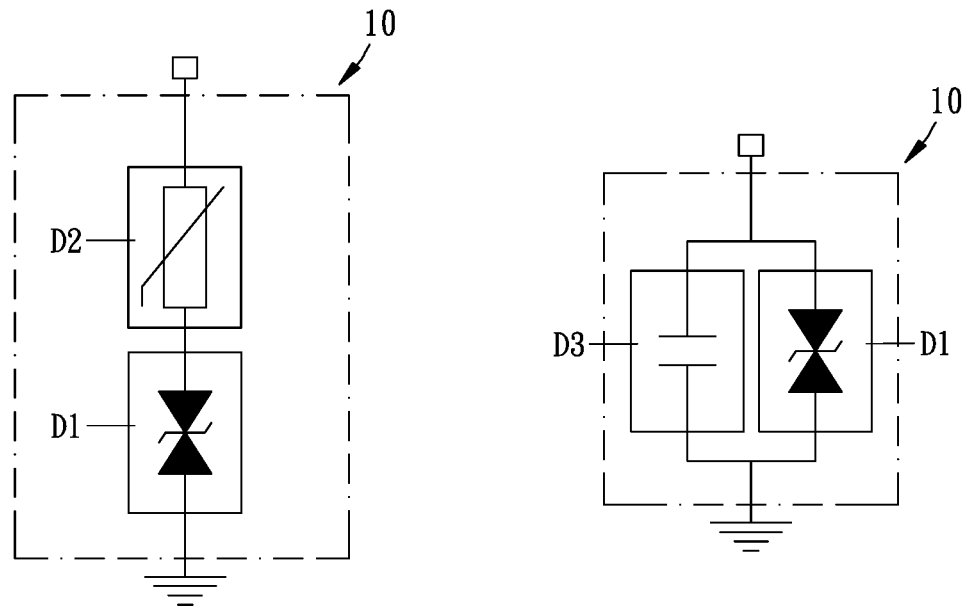
FIG. 10
FIG. 11
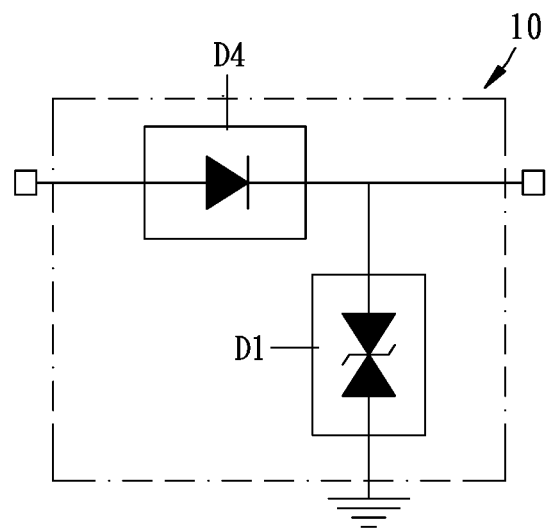
FIG. 12

MULTI-FUNCTION MINIATURIZED SURFACE-MOUNT DEVICE AND PROCESS FOR PRODUCING THE SAME

BACKGROUND OF THE PRESENT INVENTION

1. Field of the Invention

The present invention relates to a surface-mount device, and more particularly to a miniaturized surface-mount device formed as a single-piece electronic device to provide multiple functions, and a process for producing such a surface-mount device containing neither conventional lead frame nor external pins.

2. Description of Related Art

In present process for making packages of semiconductor dies, lead frames are a key component for success of resultant packages. For packaging semiconductors to possess different types or functions or for different applications, there are various forms of lead frames have been designed and developed until now.

With the trend of microminiaturization in IC processing, electronic devices used in modern compact consumer electronics are increasingly miniaturized. For example, in order to meet the miniaturization, surface-mount devices (hereinafter referred to as SMDs) provided with more compact size are suitably developed for use in connection to printed circuit boards (PCBs).

However, as far as known existing lead-frame-based packaging is concerned, when applied to such miniaturized SMDs, it is likely that a miniaturized diode die cannot be installed on a lead frame accurately. Therefore, a miniaturized SMD if poorly installed may cause the resultant package functionally inferior, or even inactive. Thus, the known existing lead-frame-based packaging is not suitably applicable to packaging miniaturized SMDs.

Another recent trend is that integrating devices with different functions are allowed to be wholly packaged into a single-piece SMD through multilayer technology. For example, an inductor and a capacitor are combined into a single-piece SMD to form an inductor-capacitor filter (also referred to as a LC filter) that has filtering function. Alternatively, a resistor and a capacitor may be combined into a single-piece SMD to form a resistance-capacitance filter (also referred to as a RC filter) that also has filtering function.

However, such a single-piece SMD made of two functionally different devices through multilayer technology tends to have the devices combined loosely, separating from each other, and becoming invalid because the two devices usually have different sintering temperatures and contraction coefficients.

SUMMARY OF THE INVENTION

In view of this, the primary objective of the present invention is to provide an effective way for packaging miniaturized SMDs. More particularly, the present invention ensures accuracy of a packaged, miniaturized SMD by using circuit boards in packaging instead of a lead frame as conventionally used.

The disclosed multi-function miniaturized SMD is a chip-type SMD formed from only one die module, with a packaged size defined by a length (L) of 0.4-2.0 mm, a width (W) of 0.2-1.3 mm, and a thickness (T) of 0.2-0.8 mm. The multi-function miniaturized chip-type SMD comprises:

- a die module, which includes one or more dies connected in series, in parallel, or in any combination of series and parallel, wherein the die module has at least one first electrode at a bottom thereof and at least one second electrode at a top thereof;
- a lower circuit board, which has a circuit electrode at a surface thereof that is electrically connected to the first electrode of the die module;
- an upper circuit board, which has a circuit electrode at a surface thereof that is electrically connected to the second electrode of the die module;
- an encapsulant, which is integrated with the lower circuit board and the upper circuit board as a unity that encases the die module and the two circuit electrodes therein, such that each of the two circuit electrodes has one end thereof extended to a surface of one of two lateral ends of the encapsulant; and
- two outer electrodes, each covering one of two lateral ends of the unity formed by the upper circuit board, the encapsulant, and the lower circuit board, so as to be electrically connected to the corresponding circuit electrode.

The present invention also provides a multi-function miniaturized SMD, which is an array-type SMD formed from at least two die modules, with a packaged size defined by a length (L) of 1.0-2.4 mm, width (W) of 0.5-1.3 mm, and a thickness (T) of 0.5-0.8 mm.

The process for producing the disclosed multi-function miniaturized SMD is free from use of lead-containing tin paste, and particularly is applicable to produce a miniaturized SMDs without external pins, which manufacturing steps comprises:

1) preforming a die having both a lower electrode at its bottom and an upper electrode at its top;
2) using a single die of Step 1), or connecting at least two dies of Step 1) in series, in parallel or in any combination of series and parallel, to make a die module, wherein the bottom of the die module has at least one first electrode, and the top of the die module has at least one second electrode;
3) preforming a lower circuit board having a circuit electrode at its surface, and performing an upper circuit board having a circuit electrode at its surface;
4) printing, applying or dispensing lead-free conductive paste onto the circuit electrode of the lower circuit board of Step 3);
5) connecting the first electrode of the die module of Step 2) to the circuit electrode of the lower circuit board by means of the lead-free conductive paste;
6) printing, applying or dispensing lead-free conductive paste onto the second electrode of the die module of Step 5);
7) connecting the circuit electrode of the upper circuit board of Step 3) to the second electrode of the corresponding die module of Step 6) by means of the lead-free conductive paste;
8) performing packaging by filling an insulating material between the lower circuit board and the upper circuit board of Step 7);
9) performing cutting along a preset cutting line so as to obtain two semi-finished electronic devices having the circuit electrodes; and
10) making outer electrodes at two lateral ends of the semi-finished electronic device of Step 9) by applying silver coating or film processing, wherein each outer electrode is in electrical connection with its own corresponding circuit electrodes, respectively, thereby the multi-function surface-mount device is obtained.

Each die for use in making the die module of the above-mentioned multi-function miniaturized SMD may be one or more selected from the group consisting of a TVS diode, a Schottky diode, a switch diode, a Zener diode, a rectifier diode, a varistor chip, a capacitor chip, a resistor chip, an inductor chip, a fuse chip, a PTC chip thermistor and an NTC chip thermistor.

Both the lower circuit board and the upper circuit board for use in making the above-mentioned multi-function miniaturized SMD is made of a ceramic substrate, a plastic substrate, a composite substrate, or a heat-dissipating substrate; wherein the ceramic substrate is an alumina substrate or an aluminum nitride (AlN) substrate; the plastic substrate is a PE substrate, a PP substrate, a PC substrate, polyimide substrate, or a substrate made of engineering plastic; and the composite substrate is a carbon-fiber substrate or a fiberglass substrate.

The encapsulant for use in making the above-mentioned multi-function miniaturized SMD is an insulating material made of a ceramic material or a plastic material, and preferably made of epoxy resins.

Each outer electrodes for use in making the above-mentioned multi-function miniaturized SMD may be made by means of coating, dispensing, evaporation or sputtering, and made of one or more of silver (Ag), gold (Au), copper (Cu), nickel (Ni), palladium (Pd) or platinum (Pt), or any metal alloy thereof.

The disclosed multi-function miniaturized SMDs and the process for producing the same provide the following beneficial effects:

1. By using the lower circuit board and the upper circuit board instead of a lead frame as used in the prior art packaging, the present invention helps to reduce costs and simplify the packaging process;
2. The single-piece SMD so packaged, as compared to the prior-art devices, uses fewer components, and can effectively reduce layout wire length and noise; and
3. The single-piece SMD can be made to provide different functions, free of the problems about functional inferiority or invalidity, and meet the demand of increasingly miniaturized electronic devices.

BRIEF DESCRIPTION OF THE DRAWINGS

FIG. 10 is an equivalent circuit diagram for such a chip-type SMD of FIG. 4 derived from one TVS diode die and one PTC die that are connected in series in a package, and have two functions by working as a temperature sensing switch and providing surge protection.

FIG. 11 is an equivalent circuit diagram for such a chip-type SMD of FIG. 5 derived from one TVS diode die and one die capacitor that are connected in parallel in a package, and have two functions by providing surge protection and working as a capacitor.

FIG. 12 is an equivalent circuit diagram for such a chip-type SMD of FIG. 5 derived from one TVS diode die and one Schottky diode die that are connected in parallel in a package, and have two functions by providing surge protection and providing backflow prevention.

DETAILED DESCRIPTION OF THE INVENTION

Figure 1:
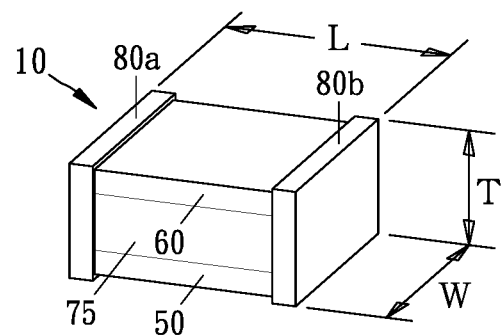
FIG. 1 is a perspective view of a chip-type SMD of the present invention.
Figure 8:
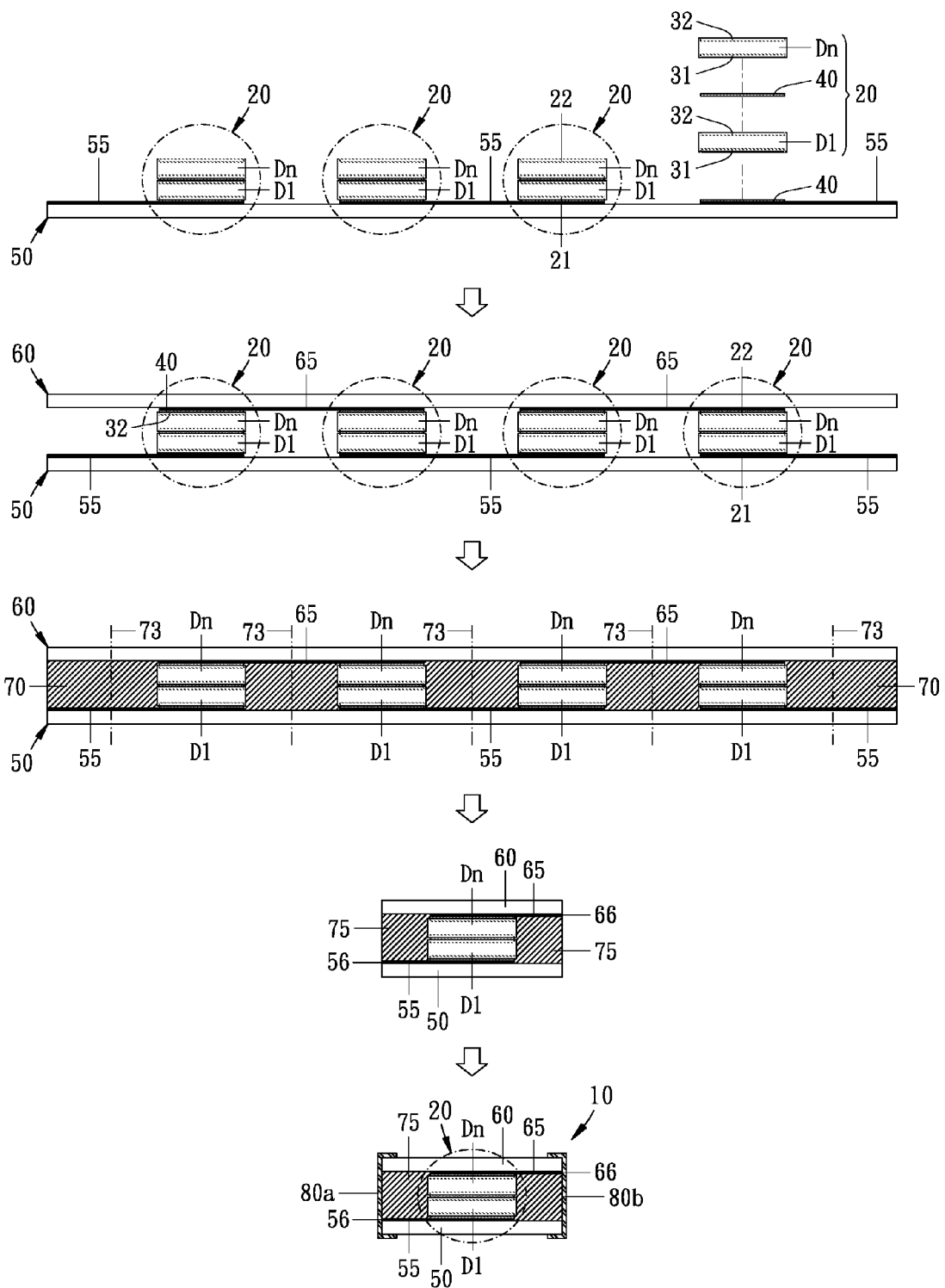
FIG. 8 is a flowchart regarding a process for producing the chip-type SMD of FIG. 1.

As shown in FIG. 1 and FIG. 8, a miniaturized surface-mount device 10 (hereinafter referred to as a chip-type SMD 10) is disclosed to have multiple functions. Particularly, the chip-type SMD 10 neither uses conventional lead frame nor uses external pins. The chip-type SMD 10 primarily comprises a die module 20, a lower circuit board 50, an upper circuit board 60, two circuit electrodes 56 and 66, an encapsulant 75, and two outer electrodes 80a and 80b.

As shown in FIG. 8, the die module 20 has a bottom provided with at least one first electrode 21 and a top provided with at least one second electrode 22. The die module 20 may optionally have a single function or multiple functions.

Figure 3:
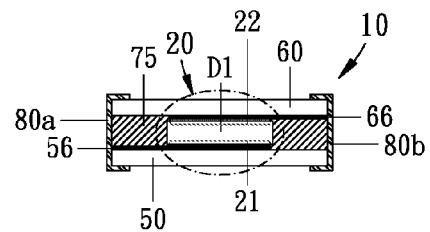
FIG. 3 is a cross-sectional view of the chip-type SMD of FIG. 1 that uses a single die and has a single function.

As shown in FIG. 3 or FIG. 8, the die module 20 if made of a single die D1 has only one function. As another embodiments of the invention, the die module 20 if made from a die D1 connected, in series, in parallel, or in any combination of series and parallel, with one or more dies Dn (n=2, 3, . . . n) with else different function(s) has therefore two or more functions.

The die D1 or the die Dn may be any one selected from the group consisting of a TVS diode, a Schottky diode, a switch diode, a Zener diode, a rectifier diode, a varistor chip, a capacitor chip, a resistor chip, an inductor chip, a fuse chip, a PTC chip thermistor and an NTC chip thermistor, but is not limited thereto.

The function(s) of the disclosed chip-type SMD 10 is determined by the die module 20 used thereon, so that the disclosed chip-type SMD 10 may have a single function or have two or more functions.

As shown in FIG. 8, the die D1 (or Dn) has the positive and negative electrodes installed on the bottom and the top of the die D1 (or Dn) respectively. In one embodiment, the die D1 (or Dn) has a lower electrode 31 at its bottom and an upper electrode 32 at its top, acting as the positive and negative electrodes of the die D1 (or Dn) for electrical connection. Thereby, the upper electrode 32 of the die D1 (or Dn) can be electrically connected to the lower electrode 31 of another die Dn by lead-free conductive paste 40 filled therebetween.

As shown in FIG. 3, where the die module 20 is formed by a single die D1 (or Dn), the first electrode 21 and the second electrode 22 of the die module 20 are realized by the lower electrode 31 and the upper electrode 32 of the die D1 (or Dn).

As shown in from FIG. 4 to FIG. 7, the die module 20 depicted is composed by the die D1 and other dies Dn (n=2, 3, . . . n) that are connected in series, in parallel, in any combination of series and parallel. The first electrode 21 of the die module 20 is realized by the lower electrode 31 of the die D1 or the die Dn that is the bottommost one of the electrodes connected in series/parallel, and the second electrode 22 of the die module 20 is realized by the upper electrode 32 of the die D1 or the die Dn that is the upmost one of the electrodes connected in series/parallel.

As shown in from FIG. 3 to FIG. 8, the disclosed chip-type SMD 10, with the lead-free conductive paste 40, has the first electrode 21 and the second electrode 22 of the die module 20 electrically connected to the circuit electrodes 56 and 66, respectively.

The circuit electrode 56 is deposited on the surface of the lower circuit board 50, and is electrically connected to the first electrode 21 of the die module 20.

Similarly, the circuit electrode 66 is deposited on the surface of the upper circuit board 60, and is electrically connected to the second electrode 22 of the die module 20.

The encapsulant 75 is filled between the lower circuit board 50 and the upper circuit board 60, so that it together with the lower circuit board 50 and the upper circuit board 60 forms a unity that encases the die module 20 and the circuit electrodes 56 and 66 therein, such that each of the two circuit electrodes 56 and 66 has one end thereof extended to a surface of one of two lateral ends of the encapsulant 75.

Each of the outer electrodes 80a and 80b covers one of two lateral ends of the unity formed by the lower circuit board 50, the encapsulant 75, and the upper circuit board 60, so as to be electrically connected to the corresponding circuit electrode 56 and 66, respectively.

Figure 2:
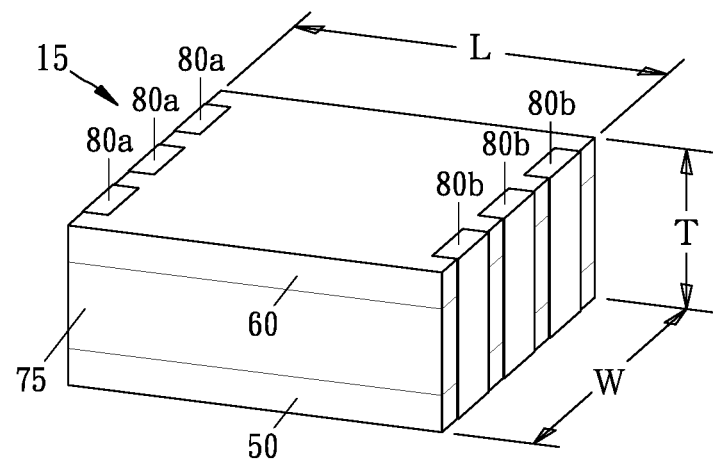
FIG. 2 is an array-type SMD of the present invention.
Figure 9:
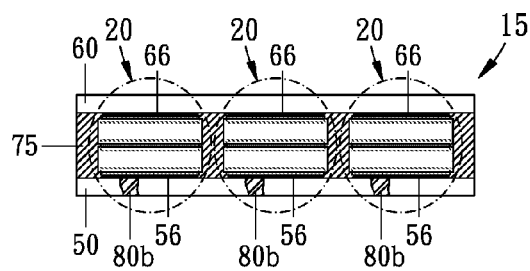
FIG. 9 is a cross-sectional view of the array-type SMD of FIG. 2 that uses three die modules and has multiple functions.

As shown in FIG. 2 and FIG. 9, in another embodiment of the disclosed chip-type SMD 10, two or more die modules 20 are packaged into a miniaturized SMD, which is hereinafter referred to the array-type SMD 15. The array-type SMD 15 primarily comprises at least two die modules 20, a lower circuit board 50, an upper circuit board 60, at least two circuit electrode 56, at least two circuit electrodes 66, an encapsulant 75, at least two outer electrodes 80a, and at least two outer electrodes 80b.

Therein, the encapsulant 75 wraps the two or more die modules 20 that are spaced. The lower circuit board 50 has two or more circuit electrodes 56 at its surface, each electrically connected to one said first electrode 21 of the die module 20. The upper circuit board 60 has two or more circuit electrodes 66 at its surface, each electrically connected to one said second electrode 22 of the die module 20. Each of the die modules 20 corresponds to the two outer electrodes 80a and 80b, and has respective electrical connection with the corresponding circuit electrodes 56 and 66.

For producing the disclosed chip-type SMD 10 or array-type SMD 15, the lower circuit board 50 and the upper circuit board 60 are used instead of a lead frame that is conventionally used in a package for electrical connection of electrodes of a SMD. Particularly, the disclosed chip-type SMD 10 or array-type SMD 15 of the invention has the following beneficial effects:
1. Without using a lead frame as used in the prior art packaging, the present invention helps to reduce costs and simplify the packaging process; and
2. The single-piece SMD so packaged, as compared to the prior-art devices, uses fewer components, possess various different functions and can effectively reduce layout wire length and noise.

As shown in FIG. 8, the process for producing the disclosed chip-type SMD 10 comprises the following steps:
1) Preforming a die Dn having a lower electrode 31 at its bottom and an upper electrode 32 at its top;
2) Using one die Dn of Step 1) to make a die module 20 only with a single die Dn, or connecting at least two dies Dn of Step 1) in series, in parallel, or in any combination of series and parallel to form a die module 20 with two or more dies Dn, wherein the bottom of the die module 20 has at least one first electrode 21, and the top of the die module 20 has at least one second electrode 22;
3) Preforming a lower circuit board 50 that has a circuit electrode 56 at its surface, and preforming an upper circuit board 60 that has a circuit electrode 66 at its surface;
4) Printing, applying or dispensing lead-free conductive paste 40 onto the circuit electrode 56 of the lower circuit board 50;
5) Connecting the first electrode 21 of the die module 20 of Step 2) to the circuit electrode 56 of the lower circuit board 50 by means of the lead-free conductive paste 40;
6) Printing, applying or dispensing lead-free conductive paste 40 onto the second electrode 22 of the die module 20 of Step 5);
7) Connecting the circuit electrode 66 of the upper circuit board 60 to the second electrode 22 of the corresponding die module 20 by means of the lead-free conductive paste 40 of Step 6);
8) Performing packaging by filling an insulating material 70 between the lower circuit board 50 and the upper circuit board 60;
9) Performing cutting along a preset cutting line 73 so as to obtain two semi-finished electronic devices having the circuit electrodes 56 and 66;
10) Making outer electrodes 80a or 80b at two lateral ends of the semi-finished electronic device of Step 9) by applying silver coating or film processing, wherein the outer electrodes 80a, 80b are in electrical connection with the corresponding circuit electrodes 56, 66, respectively, thereby finalizing the miniaturized chip-type SMD 10.

As shown in FIG. 8 and FIG. 9, the process for producing the disclosed array-type SMD 15 is similar to that of the chip-type SMD 10 except that the array-type SMD 15 uses at least two die modules 20 which are independently separated each other.

In the process for producing the disclosed chip-type SMD 10, the insulating material 70 or the encapsulant 75 may be made of a ceramic material or a plastic material, and is preferably made of epoxy resins.

In the process for producing the disclosed chip-type SMD 10, the lower circuit board 50 (or the upper circuit board 60) is made of a ceramic substrate, a plastic substrate, a composite substrate or a heat-dissipating substrate.

And, the ceramic substrate may be an alumina substrate or an aluminum nitride (AlN) substrate.

The plastic substrate may be a PE substrate, a PP substrate, a PC substrate, polyimide substrate, or a substrate made of engineering plastic.

The composite substrate may be a carbon-fiber substrate or a fiberglass substrate.

As shown in FIG. 8, the lower circuit board 50 (or the upper circuit board 60) is provided with a thin-film or thick-film circuit 55 (or 65) at its surface by means of thin-film or thick-film printing. The thin-film or thick-film circuit 55 or 65 is electrically conductive, and acts as the internal electrode of the circuit electrodes 56, 66 of the disclosed chip-type SMD 10 (or array-type SMD 15).

In the disclosed chip-type SMD 10 of the present invention and the process for producing the same, the outer electrodes 80a, 80b may be made by means of coating, dispensing, evaporation or sputtering, and made of one or more of silver (Ag), gold (Au), copper (Cu), nickel (Ni), palladium (Pd) or platinum (Pt), or any metal alloy thereof, without limitation.

In the disclosed chip-type SMD 10 of the invention and the process for producing the same, the lead-free conductive paste 40 may be made of one or more of silver (Ag), tin (Sn), copper (Cu), gold (Au), nickel (Ni), palladium (Pd) or platinum (Pt), or any combination thereof.

As described above, the disclosed process for producing the chip-type SMD 10 of the present invention helps to improve accuracy of installation of a miniaturized SMD as compared to the prior art where a lead frame is used for packaging. More detailed speaking, the disclosed process is suitable for producing a miniaturized chip-type SMD 10, and more preferable for producing such a chip-type SMD 10 as shown in FIG. 1 that has a length (L) of 0.4-2.0 mm, a width (W) of 0.2-1.3 mm, and a thickness (T) of 0.2-0.8 mm. The preferred specifications of the chip-type SMD 10 such made are listed in Table 1.

TABLE 1

| Chip-Type SMD | | Number of outer | Length | Width | Thickness |
| --- | --- | --- | --- | --- | --- |
| Model | Number of Dies | electrodes | (L) | (W) | (T) |
| 01005 | 1-4 | 2 | 0.4 ± 0.1 mm | 0.2 ± 0.1 mm | Max 0.2 mm |
| 0201 | 1-4 | 2 | 0.6 ± 0.1 mm | 0.3 ± 0.1 mm | Max 0.3 mm |
| 0402 | 1-4 | 2 | 1.0 ± 0.1 mm | 0.5 ± 0.1 mm | Max 0.5 mm |
| 0603 | 1-4 | 2 | 1.6 ± 0.1 mm | 0.8 ± 0.1 mm | Max 0.7 mm |
| 0805 | 1-4 | 2 | 2.0 ± 0.2 mm | 1.3 ± 0.2 mm | Max 0.8 mm |

The process for producing the chip-type SMD 10 mentioned above is also applicable to produce an array-type SMD 15 as shown in FIG. 2 of the present invention that has a length (L) of 1.0-2.4 mm, a width (W) of 0.5-1.3 mm, and a thickness (T) of 0.5-0.8 mm. The preferred specifications of the array-type SMD 15 such made are listed in Table 2.

TABLE 2

| Array Type SMD | | Number of outer | Length | Width | Thickness |
| --- | --- | --- | --- | --- | --- |
| Model | Number of Dies | electrodes | (L) | (W) | (T) |
| 0204 | 2-8 | equal to or less than 4 | 1.0 ± 0.1 mm | 0.5 ± 0.1 mm | Max 0.5 mm |
| 0306 | 2-8 | equal to or less than 6 | 1.6 ± 0.1 mm | 0.8 ± 0.1 mm | Max 0.7 mm |
| 0405 | 2-8 | equal to or less than 6 | 1.3 ± 0.1 mm | 1.0 ± 0.1 mm | Max 0.8 mm |
| 0508 | 2-16 | equal to or less than 8 | 2.0 ± 0.2 mm | 1.3 ± 0.2 mm | Max 0.8 mm |
| 0410 | 2-20 | equal to or less than 10 | 2.4 ± 0.2 mm | 1.0 ± 0.2 mm | Max 0.8 mm |

Moreover, the process for producing either the chip-type SMD 10 or the array-type SMD 15 of the present invention due to no use of lead-containing tin paste conforms to requirements for environmental protection.

The following examples are set forth for exemplifying various combinations of functions that may be provided by the disclosed chip-type SMD 10 or array-type SMD 15, and form no limitation to the scope of the present invention.

Example 1

As shown in FIG. 3, a chip-type SMD 10 is made from a single TVS diode D1. The SMD 10 such made has a single function of surge protection.

Example 2

Figure 4:
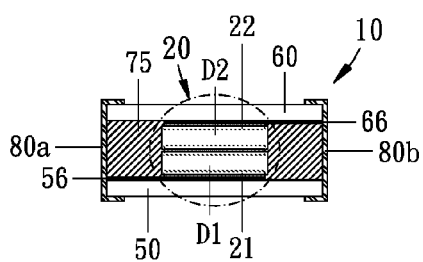
FIG. 4 is a cross-sectional view of the chip-type SMD of FIG. 1 that uses two dies connected in series and has two functions.

As shown in FIG. 4, a chip-type SMD 10 is made of two components including one TVS diode D1 of Example 1 and one PTC chip thermistor D2 that are connected in series.

According to its equivalent circuit diagram, as shown in FIG. 10, the SMD 10 such made has two functions by working as a temperature sensing switch and providing surge protection.

Example 3

Figure 5:
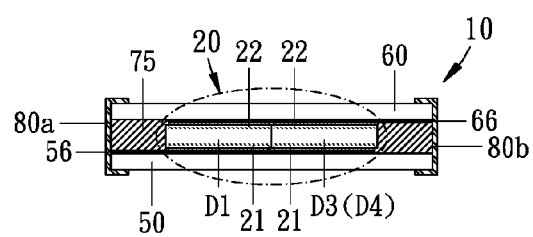
FIG. 5 is a cross-sectional view of the chip-type SMD of FIG. 1 that uses two dies connected in parallel and has two functions.

As shown in FIG. 5, a chip-type SMD 10 is made of two components including one TVS diode D1 of Example 1 and one capacitor chip D3 that are connected in parallel.

According to its equivalent circuit diagram, as shown in FIG. 11, the SMD 10 such made has two functions by providing surge protection and providing wave filtration.

Example 4

As shown in FIG. 5, a chip-type SMD 10 is made of two components including one TVS diode D1 of Example 1 and one Schottky diode D4 that are connected in parallel.

According to its equivalent circuit diagram, as shown in FIG. 12, the SMD 10 such made has two functions by providing surge protection and providing backflow prevention.

Example 5

Figure 6:
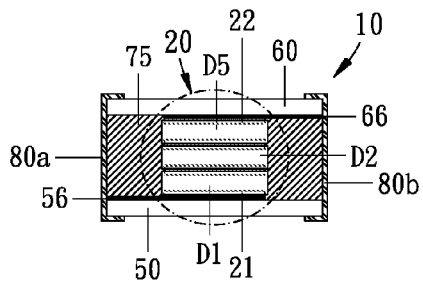
FIG. 6 is a cross-sectional view of the chip-type SMD of FIG. 1 that uses three dies connected in series and has at least two functions.

As shown in FIG. 6, a chip-type SMD 10 is made of three components including one TVS diode D1 of Example 1, one PTC chip thermistor D2, and one fuse chip D5 that are connected in series.

The SMD 10 such made has three functions by providing circuit cutout, working as temperature sensing switch, and providing surge protection.

Example 6

Figure 7:
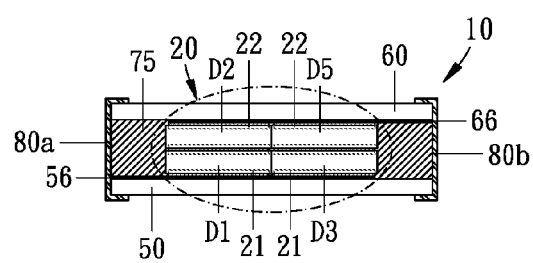
FIG. 7 is a cross-sectional view of the chip-type SMD of FIG. 1 that uses four dies connected in series and in parallel and has at least two functions.

As shown in FIG. 7, a chip-type SMD 10 is made of four components including one TVS diode D1 of Example 1 and one PTC chip thermistor D2 that are connected in series, as well as one capacitor chip D3 and one fuse chip D5 that are connected in series, wherein the two serial connections are further connected in parallel.

The SMD 10 such made has four functions by working as a temperature sensing switch, providing surge protection, providing wave filtration, and providing circuit cutout.

Examples 7-14

As shown in Table 3, in each of the examples, the SMD 10 is made of two dies of different functions that are connected either in parallel or in series.

The SMDs such made each have two functions as listed in Table 3.

TABLE 3

| Example | Die #1 | Die #2 | Package type | Function |
|---|---|---|---|---|
| 7 | Varistor chip | Capacitor chip | Two dies Parallel package | wave filtration & surge protection |
| 8 | Rectifiers diode | Capacitor chip | Two dies Parallel package | wave filtration & rectification |
| 9 | Switch diode | NTC chip thermistor | Two dies Parallel package | sensing & prevention from voltage backflow |
| 10 | Zener diode | Resistor chip | Two dies Parallel package | current limiting & voltage regulation |
| 11 | TVS diode | Capacitor chip | Two dies Serial package | low capacitance & surge protection |
| 12 | TVS diode | Inductor chip | Two dies Serial package | low- or high-pass wave filtration & surge protection |
| 13 | TVS diode | Fuse chip | Two dies Serial package | open circuit & surge protection |
| 14 | Schottky diode | Inductor chip | Two dies Serial package | wave filtration & prevention from voltage backflow |

Examples 15-16

As shown in Table 4, in each of the examples, the SMD 10 is made of three dies of different functions that are connected in parallel or in series.

The SMD 10 such made each have three functions as listed in Table 4.

TABLE 4

| Example | Die #1 | Die #2 | Die #3 | Package type | Function |
|---|---|---|---|---|---|
| 15 | TVS diode | Resistor chip | TVS diode | Three dies Serial and parallel package | Low-, high- and band-pass wave filtration |
| 16 | TVS diode | Inductor chip | TVS diode | Three dies Serial and parallel package | Low-, high- and band-pass wave filtration |

What is claimed is:

1. A multi-function surface-mount device, being a chip-type surface-mount device that has a length (L) of 0.4-2.0 mm, a width (W) of 0.2-1.3 mm, and a thickness (T) of 0.2-0.8 mm, comprising:
 a die module, which includes a single die only or includes two or more dies connected in series, in parallel, or in any combination of series and parallel, wherein the die module has at least one first electrode at a bottom thereof and at least one second electrode at a top thereof;
 and wherein each die of the die module is one selected from the group consisting of a TVS diode, a Schottky diode, a switch diode, a Zener diode, a rectifier diode, a varistor chip, a capacitor chip, a resistor chip, an inductor chip, a fuse chip, a PTC chip thermistor and an NTC chip thermistor;
 a lower circuit board, which is made of a ceramic substrate, a plastic substrate, a composite substrate, or a heat-dissipating substrate, and has a circuit electrode at a surface thereof that is electrically connected to the first electrode of the die module;
 an upper circuit board, which is made of a ceramic substrate, a plastic substrate, a composite substrate, or a heat-dissipating substrate, and has a circuit electrode at a surface thereof that is electrically connected to the second electrode of the die module;
 an encapsulant, which is integrated with the lower circuit board and the upper circuit board as a unity that encases the die module and the two circuit electrodes therein, such that each of the two circuit electrodes has one end thereof extended to a surface of one of two lateral ends of the encapsulant; and
 two outer electrodes, which are made of one or more of silver (Ag), gold (Au), copper (Cu), nickel (Ni), palladium (Pd) or platinum (Pt), or any metal alloy thereof, and each covers one of two lateral ends of the unity formed by the upper circuit board, the encapsulant and the lower circuit board, and then electrically connects to the corresponding circuit electrode respectively.

2. The multi-function surface-mount device of claim 1, wherein the die module includes two dies connected either in series or in parallel, one of the dies is a TVS diode, a Schottky diode, a switch diode, a Zener diode, a rectifier diode or a varistor chip, and the other die is a capacitor chip, a resistor chip, an inductor chip, a fuse chip, a PTC chip thermistor or an NTC chip thermistor.

3. The multi-function surface-mount device of claim 1, wherein the lower circuit board is an alumina substrate or an aluminum nitride (AlN) substrate.

4. The multi-function surface-mount device of claim 1, wherein the lower circuit board is a PE substrate, a PP substrate, a PC substrate or polyimide substrate.

5. The multi-function surface-mount device of claim 1, wherein the lower circuit board is a carbon-fiber substrate or a fiberglass substrate.

6. A multi-function surface-mount device, comprising at least two die modules of claim 1 that are spaced and encapsulated into an array-type surface-mount device having a length (L) of 1.0-2.4 mm, a width (W) of 0.5-1.3 mm, and a thickness (T) of 0.5-0.8 mm.

7. A process for producing a multi-function surface-mount device, comprising the steps of:
1) preforming a die having a lower electrode at its bottom and an upper electrode at its top;
    wherein the die is one selected from the group consisting of a TVS diode, a Schottky diode, a switch diode, a Zener diode, a rectifier diode, a varistor chip, a capacitor chip, a resistor chip, an inductor chip, a fuse chip, a PTC chip thermistor and an NTC chip thermistor;
2) using a single die of Step 1), or connecting at least two dies of Step 1) in series, in parallel or in any combination of series and parallel, to make a die module, wherein the bottom of the die module has at least one first electrode, and the top of the die module has at least one second electrode;
3) preforming a lower circuit board having a circuit electrode at its surface, and preforming an upper circuit board having a circuit electrode at its surface;
    wherein the lower circuit board or the upper circuit board is made of a ceramic substrate, a plastic substrate, a composite substrate or a heat-dissipating substrate;
4) printing, applying or dispensing lead-free conductive paste onto the circuit electrode of the lower circuit board of Step 3);
5) connecting the first electrode of the die module of Step 2) to the circuit electrode of the lower circuit board by means of the lead-free conductive paste;
6) printing, applying or dispensing lead-free conductive paste onto the second electrode of the die module of Step 5);
7) connecting the circuit electrode of the upper circuit board of Step 3) to the second electrode of the corresponding die module of Step 6) by means of the lead-free conductive paste;
8) performing packaging by filling an insulating material between the lower circuit board and the upper circuit board of Step 7);
9) performing cutting along a preset cutting line so as to obtain two semi-finished electronic devices having the circuit electrodes; and
10) making outer electrodes at two lateral ends of the semi-finished electronic device of Step 9) by applying silver coating or film processing, wherein each outer electrode is in electrical connection with its own corresponding circuit electrodes, respectively, thereby the multi-function surface-mount device is obtained.

* * * * *